United States Patent
Test et al.

(10) Patent No.: US 6,619,538 B1
(45) Date of Patent: Sep. 16, 2003

(54) NICKEL PLATING PROCESS HAVING CONTROLLED HYDROGEN CONCENTRATION

(75) Inventors: Howard R. Test, Plano, TX (US); Homer B. Klonis, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/136,943

(22) Filed: May 2, 2002

(51) Int. Cl.[7] .................... B23K 37/00; B23K 31/00; B23K 31/02
(52) U.S. Cl. .................. 228/208; 228/4.5; 228/180.5
(58) Field of Search ............... 228/110.1, 4.5, 228/180.5, 254, 262.1, 262.6, 179.1, 203, 205, 208

(56) References Cited

U.S. PATENT DOCUMENTS

| | | | | |
|---|---|---|---|---|
| 5,085,731 A | * | 2/1992 | Norman et al. | 216/105 |
| 5,215,631 A | * | 6/1993 | Westfall | 205/351 |
| 6,139,905 A | * | 10/2000 | Chen et al. | 427/124 |
| 6,258,223 B1 | * | 7/2001 | Cheung et al. | 204/242 |
| 6,376,353 B1 | * | 4/2002 | Zhou et al. | 438/612 |
| 2001/0033020 A1 | * | 10/2001 | Stierman et al. | 257/737 |
| 2001/0035452 A1 | * | 11/2001 | Test et al. | 228/180.5 |
| 2001/0055649 A1 | * | 12/2001 | Ogure et al. | 427/248.1 |
| 2002/0192938 A1 | * | 12/2002 | Wada et al. | 438/618 |

* cited by examiner

Primary Examiner—M. Alexandra Elve
Assistant Examiner—L. Edmondson
(74) Attorney, Agent, or Firm—Wade James Brady, III; Frederick J. Telecky, Jr.

(57) ABSTRACT

A flexible plating method by continuously controlling the hydrogen concentration of the plating bath by adding controlled amounts of hydrogen gas. The control of the hydrogen concentration is provided by selected distribution and number of nozzles and size of orifices; and predetermined pressure and duration of hydrogen gas flowing through the nozzles, wherein pressure and duration may be variable with time. The control of the hydrogen concentration is selected to provide a ramp-up phase, needed for a rapid plating start, followed by a saturation phase, for consistent plating stability. With metal layer plating under control, a robust, reliable and low-cost metal structure enabling electrical wire connections to the interconnecting copper metallization of ICs is formed. The structure comprises a layer of barrier metal, preferably nickel, that resists copper diffusion, deposited on the non-oxidized copper surface. The structure further comprises an outermost bondable metal layer, preferably gold, unto which a metal wire is bonded for metallurgical connection.

9 Claims, 2 Drawing Sheets

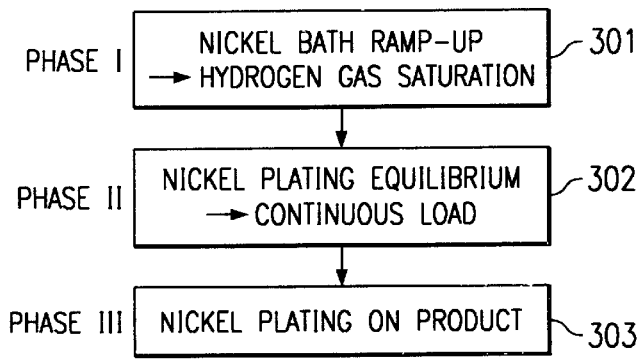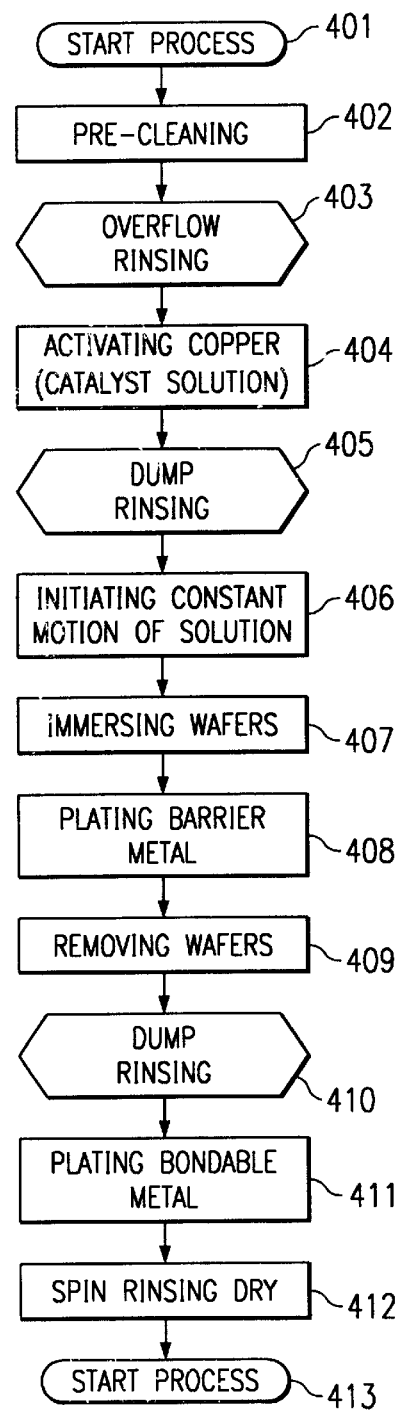

NICKEL PLATING PROCESS HAVING CONTROLLED HYDROGEN CONCENTRATION

FIELD OF THE INVENTION

The present invention is related in general to the field of electronic systems and semiconductor devices, and more specifically to the process of preparing integrated circuit bond pads for wire bonding in copper-metallized ICs.

DESCRIPTION OF THE RELATED ART

In integrated circuits (IC) technology, pure or doped aluminum has been the metallization of choice for interconnection and bond pads for more than four decades. Main advantages of aluminum include ease of deposition and patterning. Further, the technology of bonding wires made of gold, copper, or aluminum to the aluminum bond pads has been developed to a high level of automation, miniaturization, and reliability.

In the continuing trend to miniaturize ICs, the RC time constant of the interconnection between active circuit elements increasingly dominates the achievable IC speed-power product. Consequently, the relatively high resistivity, of the interconnecting aluminum now appears inferior to the lower resistivity of metals such as copper. Further, the pronounced sensitivity of aluminum to electromigration is becoming a serious obstacle. Consequently, there is now a strong drive in the semiconductor industry to employ copper as the preferred interconnecting metal, based on its higher electrical conductivity and lower electromigration sensitivity. From the standpoint of the mature aluminum interconnection technology, however, this shift to copper is a significant technological challenge.

Copper has to be shielded from diffusing into the silicon base material of the ICs in order to protect the circuits from the carrier lifetime killing characteristic of copper atoms positioned in the silicon lattice. For bond pads made of copper, the formation of copper(I)oxide films during the manufacturing process flow has to be minimized, since these films severely inhibit reliable attachment of bonding wires, especially for conventional gold-wire ball bonding. In contrast to aluminum oxide films overlying metallic aluminum, copper oxide films overlying metallic copper cannot easily be broken by a combination of thermocompression and ultrasonic energy applied in the bonding process. As further difficulty, bare copper bond pads are susceptible to corrosion.

In order to overcome these problems, a process has been disclosed to cap the clean copper bond pad with a layer of aluminum and thus re-construct the traditional situation of an aluminum pad to be bonded by conventional gold-wire ball bonding. A suitable bonding process is described in U.S. Pat. No. 5,785,236, issued on Jul. 28, 1998 (Cheung et al., "Advanced Copper Interconnect System that is Compatible with Existing IC Wire Bonding Technology"). The described approach, however, has several shortcomings.

First, the fabrication cost of the aluminum cap is higher than desired, since the process requires additional steps for depositing metal, patterning, etching, and cleaning. Second, the cap must be thick enough to prevent copper from diffusing through the cap metal and possibly poisoning the IC transistors. Third, the aluminum used for the cap is soft and thus gets severely damaged by the markings of the multiprobe contacts in electrical testing. This damage, in turn, becomes so dominant in the ever decreasing size of the bond pads that the subsequent ball bond attachment is no longer reliable.

A low-cost structure and method for capping the copper bond pads of copper-metallized ICs has been disclosed on U.S. patent application Ser. No. 09/775,322, filed on Feb. 1, 2001 (Stierman et al., "Structure and Method for Bond pads of Copper-Metallized Integrated circuits"). A barrier metal layer is deposited over the copper, preferably nickel. For some applications, the nickel layer is followed by a second barrier layer, preferably palladium. The outermost layer is bondable, preferably gold. Based on this metallization sequence, a gold wire bonding method has been described in U.S. patent application Ser. No. 09/817,696, filed on Mar. 23, 2001 (Test et al., "Wire Bonding Process for Copper-Metallized Integrated Circuits").

Especially in the case of electroless nickel, for the control of the deposition process and the structural quality of the deposited layer, a continuous control of the plating bath is necessary. An urgent need has, therefore, arisen for a flexible and reliable method of plating bath control in the nickel plating cycle in order to create the controlled capping of bond pads for subsequent wire bonding. The plating control methods should be flexible enough to be applied for different IC product families and a wide spectrum of design and process variations. Preferably, these innovations should be accomplished while shortening production cycle time and increasing throughput, and without the need of expensive additional manufacturing equipment.

SUMMARY OF THE INVENTION

The "Fundamentals of Electrochemical Deposition" have been described in the book by M. Paunovic and M. Schlesinger (John Wiley & Sons, New York, 1998. Pages 139 and 140 refer to the electroless deposition of nickel. The chemical reactions have been summarized earlier in the "Electroplating Engineering Handbook" by Lawrence J. Durney (van Nostrand Reinhold Comp., New York, 1984). Pages pp. 445 through 457 give details of the electroless catalytic nickel deposition specifically for acidic nickel/phosphorus solutions. The interaction between the hypophosphite ion and water leads to the formation of a hydride ion, H-, which then acts to reduce the nickel ions in solution. The atomic hydrogen forms molecules which are subsequently liberated as hydrogen gas. For the nickel plating bath, the equations quoted are:

In acid solution:

$$H_2PO_2^- + H_2O \rightarrow HPO_3^{--} + 2H^+ + H^-$$

In alkaline solution:

$$H_2PO_2^- + 2OH^- \rightarrow HPO_3^{--} + H_2O + H^-$$

Further:

$$Ni^{++} + 2H^- \rightarrow Ni + 2H$$

$$H^+ + M^- \rightarrow H_2$$

The acid formulations offer advantages relative to speed of nickel deposition, physical characteristics of the deposit, and stability of the plating bath. With a wide range of organic and inorganic acid salts available, the electroless nickel bath operates as follows:

Ni+++sodium hypophosphite+(buffers, complexors, accelerators, stabilizers, wetters, moderators)→@catalytic surface→(Ni+P) deposit+H2+sodium orthophosphite.   Eq. (*)

It is advantageous for plating nickel uniformly that free hydrogen gas is adsorbed at the surface of the freshly plated nickel. This is best accomplished by intentionally controlling the hydrogen level in the plating bath at a predetermined value.

Besides the temperature of the bath, the factor which influences the nickel deposition rate most is the pH value of the bath. The minimum value for deposition is 3.0, the maximum value is 7.0 at which the hypophosphite spontaneously oxidizes by the reaction:

$$(H2PO2)^- + OH^- \rightarrow (HPO3)^{--} + H2.$$

In practice, the preferable pH range is between 4.3 and 4.9.

When the above reactions are applied to the electroplating process in the fabrication of nickel layers as needed in integrated circuit (IC) bond pad structures, the control of the hydrogen level in the plating bath emerged as a critical factor. The present invention discloses a flexible plating method by continuously controlling the hydrogen concentration of the plating bath by adding controlled amounts of hydrogen gas. The control of the hydrogen concentration is provided by

- selected distribution and number of nozzles and size of orifices; and
- predetermined pressure and duration of hydrogen gas flowing through the nozzles, wherein pressure and duration may be variable with time.

The control of the hydrogen concentration is selected so that the concentration provides a ramp-up phase, needed for a rapid plating start, followed by a saturation phase, needed for consistent plating stability.

With the metal layer plating process under control, the present invention discloses a robust, reliable and low-cost metal structure enabling electrical wire connections to the interconnecting copper metallization of ICs. The structure comprises a layer of barrier metal that resists copper diffusion, deposited on the non-oxidized copper surface. The structure further comprises an outermost bondable metal layer, unto which a metal wire is bonded for metallurgical connection.

The barrier metal is selected from a group consisting of nickel, cobalt, chromium, molybdenum, titanium, tungsten, and alloys thereof. The outermost metal layer is selected from a group consisting of gold, platinum, and silver.

The present invention is related to high density and high speed ICs with copper interconnecting metallization, especially those having high numbers of metallized inputs/outputs, or "bond pads". These circuits can be found in many device families such as processors, digital and analog devices, logic devices, high frequency and high power devices, and in both large and small area chip categories.

It is an aspect of the present invention to be applicable to bond pad area reduction and thus supports the shrinking of IC chips. Consequently, the invention helps to alleviate the space constraint of continually shrinking applications such as cellular communication, pagers, hard disk drives, laptop computers and medical instrumentation.

Another aspect of the invention is to fabricate the bond pad metal caps by the self-defining process of electroless deposition, thus avoiding costly photolithographic and alignment techniques.

Another aspect of the invention is to provide control means from the outside into production processes which need a high degree of flexibility and stability. Specifically, the addition of outside hydrogen gas into electrochemical reactions provides sensitive and immediate control of plating depositions and, to some degree, of the quality of the deposited layer.

Another aspect of the invention is to provide process concepts which are flexible so that they can be applied to many families of semiconductor products, and are general so that they can be applied to several generations of products.

The technical advances represented by the invention, as well as the aspects thereof, will become apparent from the following description of the preferred embodiments of the invention, when considered in conjunction with the accompanying drawings and the novel features set forth in the appended claims.

BRIEF DESCRIPTION OF THE DRAWINGS

FIG. 1A shows a bondable cap of stacked layers over a bond pad of an integrated circuit having copper metallization.

FIG. 1B shows the bond pad of FIG. 1A including a ball-bonded wire.

FIG. 3 is a schematic block diagram of the phases of the bond pad plating process according to the invention.

FIG. 4 is a block diagram of the plating process flow of the phase for fabricating the bond pad cap of semiconductor wafers.

DETAILED DESCRIPTION OF THE PREFERRED EMBODIMENTS

The present invention is related to U.S. patent applications Ser. No. 09/777,322, filed on Feb. 1, 2001 (Stierman et al., "Structure and Method for Bond Pads of Copper-Metallized Integrated Circuits"); Ser. No. 09/817,696, filed on Mar. 23, 2001 (Test et al., "Wire Bonding Process for Copper-Metallized Integrated Circuits"); and Ser. No, 09/817,694, filed on Mar. 26, 2001 (Amador et al., "Fixture and Method for Uniform Electroless Metal Deposition on Integrated Circuit Bond Pads"). These applications are incorporated herein by reference.

Figure 1A:
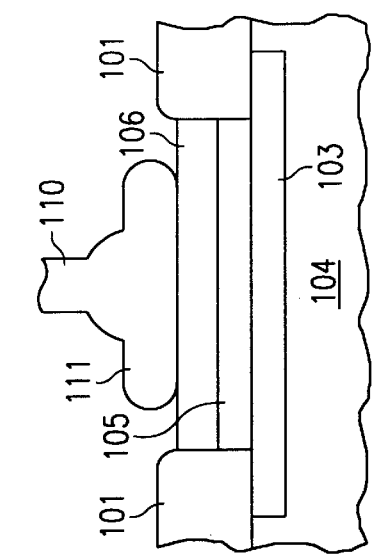
FIGS. 1A and 1B illustrate schematic cross sections of the preferred embodiment of the invention.

FIG. 1A shows a schematic cross section of an integrated circuit (IC) bond pad, generally designated 100. The IC has copper interconnecting metallization and is covered by a moisture-impenetrable protective overcoat 101. This overcoat is usually made of silicon nitride, commonly 0.5 to 1.0 μm thick. A window 102 is opened in the overcoat in order to expose portion of the copper metallization 103. Not shown in FIG. 1A is the underlayer embedding the copper and preventing its diffusion into parts of the IC (usually made of tantalum nitride, tantalum silicon nitride, tungsten nitride, tungsten silicon nitride, titanium, titanium nitride, or titanium tungsten).

In FIG. 1A, the dielectric IC portions 104 are only summarily indicated. These electrically insulating portions may include not only the traditional plasma-enhanced chemical vapor deposited dielectrics such as silicon dioxide, but also newer dielectric materials having lower dielectric constants, such as silicon-containing hydrogen silsesquioxane, organic polyimides, aerogels, and parylenes, or stacks of dielectric layers including plasma-generated or ozone tetraethylorthosilicate oxide. Since these materials are less dense and mechanically weaker than the previous standard insulators, the dielectric under the copper is often reinforced.

Since copper is susceptible to corrosion and even thin copper(I)oxide films are difficult to bond to, the present invention provides processes of a cap formed over the exposed copper. The cap consists of a stack of metals having coordinated thicknesses such that the stack satisfies three requirements:

The cap acts as a barrier against the up-diffusion of copper to the surface of the cap where the copper might impede the subsequent wire bonding operation.

The cap is fabricated by a technique, which avoids expensive photolithographic steps. Specifically, an electroless process is used to deposit the cap metal layers.

The cap has an outermost metal surface which is bondable. Specifically, conventional ball and wedge bonding techniques can be used to connect metal wires and other coupling members metallurgically to the bond pad.

Figure 1B:
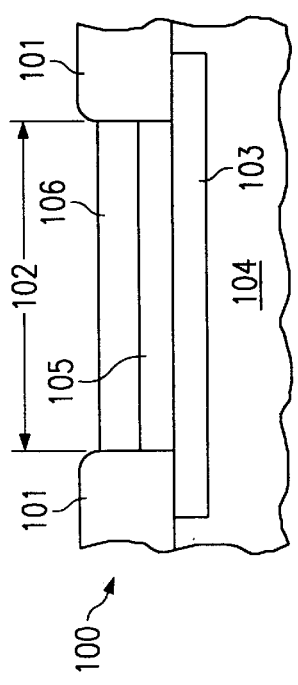

As indicated in FIG. 1B, wire ball bonding is the preferred method of using coupling members to create electrical connections. Another method is ribbon bonding employing wedge bonders. In contrast to wedge bonding, ball bonding operates at elevated temperatures for which the materials and processes of this invention need to be harmonized.

The wire bonding process begins by positioning both the IC chip with the bond pads and the object, to which the chip is to be bonded, on a heated pedestal to raise their temperature to between 100 and 300° C. A wire 110 (in FIG. 1B), typically of gold, gold-beryllium alloy, other gold alloy, copper, aluminum, or alloys thereof, having a diameter typically ranging from 18 to 33 $\mu$m, is strung through a capillary. At the tip of the wire, a free air ball is created using either a flame or a spark technique. The ball has a typical diameter from about 1.2 to 1.6 wire diameters. The capillary is moved towards the chip bonding pad (102 in FIG. 1A) and the ball is pressed against the metallization of the bonding pad cap (layer 106 in FIGS. 1A and 1B). A combination of compression force and ultrasonic energy creates the formation of a strong metallurgical bond by metal interdiffusion. At time of bonding, the temperature usually ranges from 100 to 300° C. In FIGS. 1B, schematic form 111 exemplifies the final shape of the attached "ball" in wire ball bonding.

The metal cap over the copper 103 is provided by two layers:

Layer 105 is positioned over copper 203, sometimes deposited on a seed metal layer (not shown in FIGS. 1A and 1B). Examples for layer 105 are nickel, cobalt, chromium, molybdenum, titanium, tungsten, and alloys thereof. These metals are inexpensive and can be deposited by electroless plating; however, they are poorly bondable. In these metals, copper has a diffusion coefficient of less than $1 \times 10E-23$ cm$^2$/s at 250° C. Consequently, these metals are good copper diffusion barriers. The layer thicknesses required to reduce copper diffusion by more than 80% compared to the absence of the layers are obtained by diffusion calculation. Generally, a barrier thickness from about 0.5 to 1.5 $\mu$m will safely meet the copper reduction criterion. An important feature of the barrier layer, achieved by the present invention, is the controlled thickness and the uniformity of the metal layer.

Layer 106 is positioned over layer 105 as the outermost layer of the cap; it is bondable so that it can accept the wire bond 111. Examples for layer 106 are gold, platinum, palladium, and silver. In addition, these metals have a diffusion coefficient for the metals used in barrier 105 (such as nickel) of less than $1 \times 10E-14$ cm$^2$/s at 250° C. Consequently, these metals are good diffusion barriers for the materials of layer 105. Again, the layer thicknesses required to reduce the up-diffusion of metal used in layer 105 by more than 80% compared to the absence of layer 106 are obtained from diffusion calculations. Generally an outermost layer thickness of 1.5 $\mu$m or somewhat less will safely meet the reduction criterion for metal diffusing from layer 105.

Figure 2:
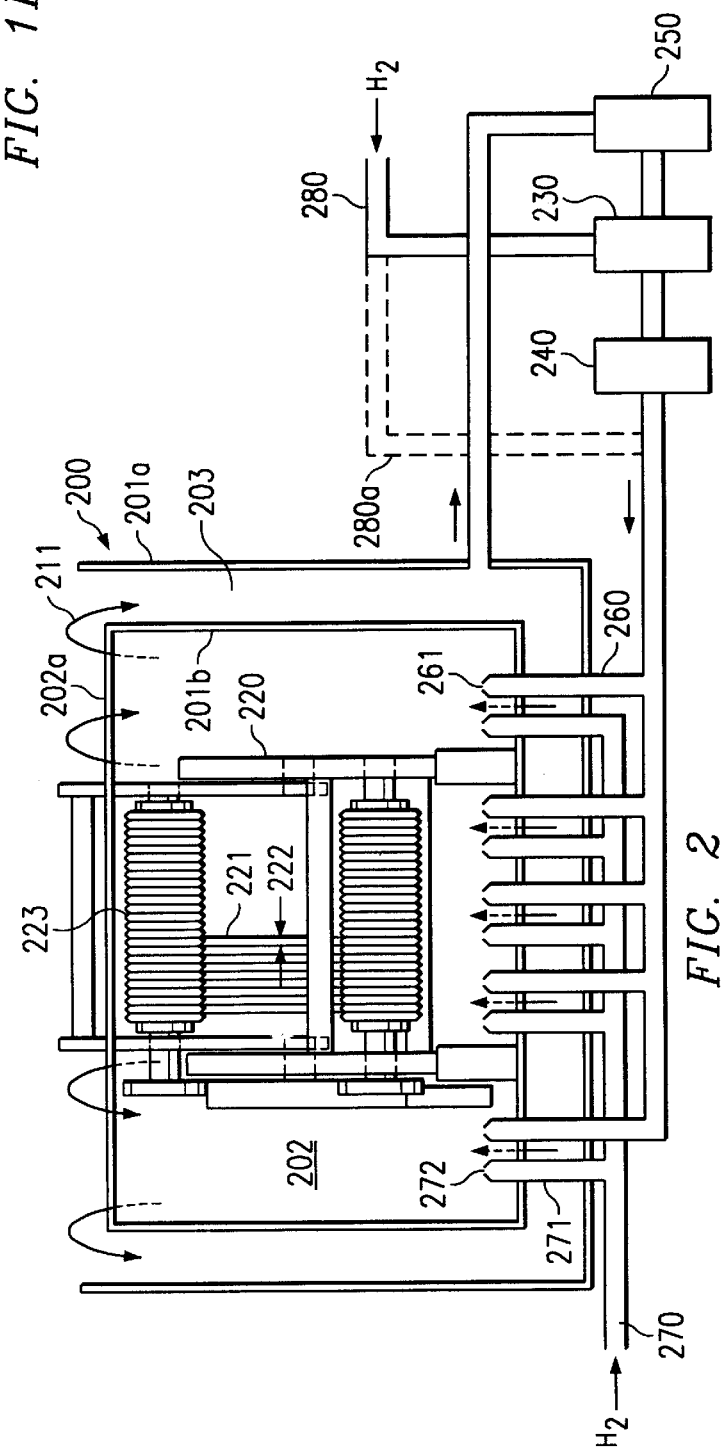
FIG. 2 is a schematic composite side view and cross section of the plating tank and apparatus for controlled electroless plating, including the supply lines for controlled hydrogen gas level/concentration.

The apparatus for the controlled electroless plating process on a plurality of IC wafers, according to the invention, is illustrated in FIG. 2. This figure shows schematically the cross section through a plating tank, generally designated 200, filled by the liquid plating solution 202 up to the surface 202a of the solution. The plating tank has an outer wall 201a and an inner wall 201b, separated by a gap 203, which enables the reflow of the liquid. In FIG. 2, arrows indicate the flow of the liquid solution. As can be seen, the solution enters the tank from the bottom (arrows 210, the nozzles are described below), moves in laminar flow at constant speed upward (for example, at a speed of 20 cm/min) through the tank, and exits from the tank surface (arrows 211) by overflowing into the reflow gap 203. After reaching the tank bottom, the liquid is flowing to pump 250, is pumped through filter 230 and heater 240, and the flow cycle begins anew. The liquid re-enters the tank through a plurality of supply lines 260, which may have nozzle orifices 261.

Further shown in FIG. 2 is the apparatus/fixture for holding a plurality of wafers. In FIG. 2, the fixture is illustrated in side view 220. As can be seen from FIG. 2, the fixture 220 is loaded with a batch of wafers 221 (usually 10 to 30 wafers) contained on their side edges while their active and passive surfaces are exposed to the plating solution (the passive surfaces are covered by a protective resist). In the fixture, the wafers 221 are held approximately parallel the each other at predetermined distances 222. A typical distance is in the range from about 5 to 10 mm and thus several times wider than the thickness of a wafer (about 0.25 to 1.00 mm). At their rims, the wafers are loosely held in grooves 223 of rollers, which are made of a chemically inert plastic material such as polypropylene. On its flow from the bottom to the surface of the tank, the plating solution flows substantially parallel to the active surface of the wafers contained in the fixture.

An essential feature of the electroless plating process according to the invention is the control and constancy of the plating solution (202 in FIG. 2) based on Eq. (*). Two features of the chemical reaction are especially suitable for control:

control of the level/concentration of hydrogen gas; and control of the adsorption of hydrogen on the freshly plated nickel (catalytic action).

Additional control features include the time and temperature of the plating solution.

The control of the level/concentration of hydrogen gas is achieved by one of two embodiments. In the first embodiment, the hydrogen gas is fed into the plating tank through a separate supply line 270. From the supply line, a plurality of entry ports 271 connect into the tank; each entry port 271 has a nozzle orifice 272. The control of the hydrogen gas level/concentration is achieved by:

selecting distribution and number of nozzles and size of orifices; and predetermining pressure and duration of hydrogen gas flowing through the nozzles, wherein pressure and duration may be variable with time.

In the second embodiment, the hydrogen gas is fed into the plating solution directly by a supply line 280 which is, for example, connected into the filter unit 230. Modifying this embodiment, the supply line 280 may feed, through a manifold, at any suitable point into the plating solution return line. This modification is indicated in FIG. 2 by the dashed extension 280a of the hydrogen line 280. The control of the hydrogen gas level/concentration is achieved by regulating pressure and duration of the hydrogen gas flowing through line 280, wherein pressure and duration may be variable with time.

The preferred electroless process flow used for plating uniform metal layers as caps onto exposed copper metallizations such as bond pads of ICs positioned on the active surface of semiconductor wafers has the following phases and steps. The example is chosen for fabricating a cap consisting of two metal layers involving two plating tanks, preferably a nickel plating tank and a gold plating tank. Referring to the nickel plating tank, the process phases are summarized in FIG. 3:

- 301: Phase I: Ramping up the plating bath, including ramping up the hydrogen concentration to saturation level.
- 302: Phase II: Reaching plating equilibrium using large-area load sample.
- 303: Phase III: Depositing plated layers on product (semiconductor wafers).

Each of these phases includes process steps analogous to the steps listed in FIG. 4. Note that the production semiconductor wafers of Phase III must have the back sides protected (for example, by photoresist). The exposed copper surface of the IC bond pads is cleaned using a plasma ashing process for about 2 minutes. After completing the plating process, the backside protection may be stripped again.

The process flow of FIG. 4 is the sequence of steps needed for Phase III using actual product wafers.

- Step 401: Loading the wafers into the apparatus/fixture described above for controlled electroless plating.
- Step 402: Cleaning by immersing the wafers, having the exposed copper of the bond pads, in a solution of sulfuric acid, nitric acid, or any other acid, for about 50 to 60 seconds.
- Step 403: Rinsing in overflow rinser for about 100 to 180 seconds.
- Step 404: Immersing the wafers in a catalytic metal chloride solution, such as palladium chloride, for about 40 to 80 seconds. This step "activates" the copper surface, i.e., a layer of seed metal (such as palladium) is deposited onto the clean non-oxidized copper surface.
- Step 405: Rinsing in dump rinser for about 100 to 180 seconds.
- Step 406: Initiating motion at constant speed of first electroless plating solution in plating tank. If nickel is to be plated, the solution consists of an aqueous solution of a nickel salt, such as nickel chloride, sodium hypophosphite, buffers, complexors, accelerators, stabilizers moderators, and wetting agents (see Eq.*).
- Step 407: Immersing the wafers into the electroless plating solution. The solution, flowing at constant speed, flows substantially parallel to the active surface of the wafers.
- Step 408: Plating layer electrolessly. If a nickel layer is to be plated, plating between 150 and 180 seconds will deposit about 0.4 to 0.6 $\mu$m thick nickel layer.
- Step 409: Removing wafers from plating solution.
- Step 410: Rinsing in dump rinser for about 100 to 180 seconds.
- Step 411: Repeating Steps 406 through 410 for second electroless plating solution, varying composition of solution and plating time according to metal-to-be-plated. Electroless plating of outermost layer, which is bondable and simultaneously provides a barrier against up-diffusion of the underlying barrier metal. If gold or palladium is selected, plating between 150 to 180 seconds will deposit about 0.4 to 0.6 $\mu$m thick gold or palladium, respectively. A preferred process uses first an immersion step with self-limiting surface metal replacement. If gold is selected, plating between 400 and 450 seconds will deposit approximately 30 nm thick gold. As a second step for thicker metal layer (0.5 to 1.5 $\mu$m thick), the immersion process is followed by an autocatalytic process step.
- Step 412: Spin rinsing and drying for about 6 to 8 minutes.
- Step 413: Unloading wafers from plating apparatus/fixture.

It is an essential technical advantage of the present invention that the process flow of the Phase I bath ramp-up can be much faster due to the addition of controlled amounts of hydrogen gas. Compared to the time of about 100 min needed in standard processing for heating the bath and subsequently saturating the hydrogen level, the invention provides simultaneous heating and hydrogen introduction. The time needed for these concurrent process steps is now less than 60 min. Furthermore, the addition of hydrogen gas may be computer controlled and can thus be increased and decreased in discretionary manner.

Similarly, the process flow of the Phase II bath equilibrium using a continuous load is substantially supported by the addition of controlled amounts of hydrogen gas. It is possible to even replace the continuous load altogether by the steady state of hydrogen saturation, reached quickly, and maintained carefully, by the addition of controlled amounts of hydrogen gas.

The metallurgical connection of metal wires or ribbons to the outermost bondable metal layer, attained by a ball or wedge bonding process subsequent to the Phase III plating, is described above.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention can be applied to IC bond pad metallizations other than copper, which are difficult or impossible to bond by conventional ball or wedge bonding techniques, such as alloys of refractory metals and noble metals. As another example, the invention applies to immersion plating and autocatalytic plating. A sequence of these plating techniques is particularly useful for electroless plating of gold layers. As another example, the invention provides for easy control of the uniformity of plated layers by modifying individually the addition of hydrogen gas, the flow speed of the plating solution, or the rotation speed of the wafers, even in the course of one plating deposition. It is therefore intended that the appended claims encompass any such modifications or embodiments.

We claim:

1. A method for forming metallurgical connections between metal wires and bond pads positioned on integrated circuits having copper interconnecting metallization, comprising the steps of:

activating the surface of said copper metallization by creating a non-oxidized copper surface;

depositing a layer of seed metal;

providing a barrier metal plating bath;

continuously controlling the hydrogen concentration of said bath by adding hydrogen gas, whereby the plating process is controlled for improving metal deposition;

plating a layer of barrier metal that resists copper diffusion by electroless deposition in said bath, under continuously controlled hydrogen concentration;

plating an outermost layer of bondable metal by electroless or immersion deposition; and bonding one of said metal wires onto said outermost metal.

2. The method according to claim 1 further including the steps of:

providing selected distribution and number of nozzles and size of orifices; and controlling the pressure and duration of hydrogen gas flowing through said nozzles, and varying said pressure and duration with time.

3. The method according to claim 2 wherein said control of said hydrogen concentration is selected so that said concentration provides a ramp-up phase, needed for a rapid plating start, followed by a saturation phase, needed for consistent plating stability.

4. The method according to claim 1 wherein said barrier metal is selected from a group consisting of nickel, cobalt, chromium, molybdenum, titanium, tungsten, and alloys thereof.

5. The method according to claim 4 wherein said barrier layer has a thickness between 0.5 and 1.5 $\mu$m.

6. The method according to claim 1 wherein said bondable metal is selected from a group consisting of gold, platinum, and silver.

7. The method according to claim 1 further comprising the plating of an additional barrier layer directly over the plated barrier metal, including palladium, platinum, cobalt, or osmium, before the deposition of said bondable metal.

8. The method according to claim 1 wherein said seed metal is palladium or tin.

9. The method according to claim 1 wherein said metal wires are selected from a group consisting of gold, copper, aluminum, and alloys thereof.

* * * * *